US008847705B2

(12) United States Patent
Kameya

(10) Patent No.: US 8,847,705 B2
(45) Date of Patent: Sep. 30, 2014

(54) COMMON MODE FILTER

(75) Inventor: Masaaki Kameya, Shimane (JP)

(73) Assignee: Matsue Elmec Corporation, Matsue-shi (JP)

( * ) Notice: Subject to any disclaimer, the term of this patent is extended or adjusted under 35 U.S.C. 154(b) by 0 days.

(21) Appl. No.: 13/376,094

(22) PCT Filed: Oct. 13, 2010

(86) PCT No.: PCT/JP2010/067918
§ 371 (c)(1),
(2), (4) Date: Dec. 2, 2011

(87) PCT Pub. No.: WO2011/052374
PCT Pub. Date: May 5, 2011

(65) Prior Publication Data
US 2012/0075036 A1 Mar. 29, 2012

(30) Foreign Application Priority Data
Nov. 2, 2009 (JP) .................. 2009-252046

(51) Int. Cl.
*H03H 7/075* (2006.01)
*H03H 7/42* (2006.01)
*H03H 7/01* (2006.01)
*H03H 7/09* (2006.01)

(52) U.S. Cl.
CPC ............ *H03H 7/427* (2013.01); *H03H 7/1733* (2013.01); *H03H 7/1708* (2013.01); *H03H 7/09* (2013.01); *H03H 7/1725* (2013.01); *H03H 7/1766* (2013.01); *H03H 7/075* (2013.01)
USPC ........................................... 333/181; 333/12

(58) Field of Classification Search
CPC ..... H03H 1/0007; H03H 7/075; H03H 7/427; H04B 3/30; H04B 15/00; H04B 2203/5491

USPC ............................................ 333/181, 12, 167
See application file for complete search history.

(56) References Cited

U.S. PATENT DOCUMENTS 4,126,837 A * 11/1978 Koyamada et al. ........... 333/193
4,287,393 A * 9/1981 Reuvekamp ................ 333/170
(Continued)

FOREIGN PATENT DOCUMENTS

JP        59-159187 U    10/1984
JP        5-009023 U     2/1993
(Continued)

OTHER PUBLICATIONS

Electromagnetic Delay Lines; http://www.rhombus-ind.com/app-note/passive.pdf, Jun. 2001.*
International Search Report of PCT/JP2010/067918, mailing date Jan. 11, 2011.

*Primary Examiner* — Benny Lee
*Assistant Examiner* — Rakesh Patel
(74) *Attorney, Agent, or Firm* — Westerman, Hattori, Daniels & Adrian, LLP

(57) ABSTRACT

There is provided a common mode filter capable of allowing an ultrahigh speed differential signal to transmit and hardly allowing a common mode noise to transmit, comprising: a lumped-constant differential delay line DL formed by arranging inductors Lo, being passive series elements, and capacitors Co, being passive parallel elements, in a ladder-shaped differential four terminal network composed of the passive series elements and the passive parallel elements arranged in the differential lines 1, 3. In the lumped-constant differential delay line DL, the capacitors Co, being the parallel elements, are formed of two capacitors connected in series equivalent to each other and having same values with each other such as Co/2 and Co/2, or Co and Co. Inductors L1 to L4 and resistors R1 to R4 for attenuating the common mode noise are connected between connection points T1 to T4 of the capacitors Co/2 or Co connected in series, and a ground potential, thus forming a common mode noise attenuating series resonance circuit together with the capacitors Co/2, Co.

10 Claims, 13 Drawing Sheets

(56) References Cited

U.S. PATENT DOCUMENTS

| | | | | |
|---|---|---|---|---|
| 4,383,229 A | * | 5/1983 | Jones | 333/176 |
| 4,761,623 A | * | 8/1988 | Schneider | 333/167 |
| 6,031,435 A | * | 2/2000 | Inose et al. | 333/193 |
| 6,608,536 B2 | * | 8/2003 | Fallahi | 333/168 |

FOREIGN PATENT DOCUMENTS

| | | |
|---|---|---|
| JP | 2000-058343 A | 2/2000 |
| JP | 2004-266634 A | 9/2004 |
| JP | 2009-220549 A | 10/2009 |
| JP | 2011-071710 A | 4/2011 |

* cited by examiner

PRIOR ART

PRIOR ART

PRIOR ART

COMMON MODE FILTER

TECHNICAL FIELD

The present invention relates to a common mode filter, and particularly relates to the common mode filter capable of cutting off an undesirable common mode noise and hardly causing an electromagnetic interference to occur, while transmitting an ultrahigh speed differential signal which is propagated through an ultrahigh speed differential line.

DESCRIPTION OF RELATED ART

In an electronic device, noise is an undesirable presence, and therefore there are many proposals for removing the noise.

Particularly, in a recent high-speed serial transmission, a transmission speed of a transmission signal is GHz bandwidth and is becoming faster, and its wavelength is becoming shorter. Accordingly, there is a high probability that the wavelength corresponds to the integral times of a circuit pattern length. Therefore, there is a problem that the transmission signal is emitted into a space, with a circuit pattern as an antenna, thus causing an electromagnetic radiation noise to occur.

However, in the high-speed serial transmission, differential lines are used in most cases, and therefore coupling of electromagnetic fields occurs between the differential lines, thus hardly allowing the transmission signal to be radiated outside.

However, the common mode noise having an in-phase signal is generated by a slight asymmetry property of the differential lines and a slight phase deviation in IC. Such a noise is propagated through the differential lines, and is easily radiated to the outside because there is no coupling of the electromagnetic fields between differential lines. Thus, the electromagnetic radiation noise is easily generated.

Therefore, in a field of the high-speed serial transmission using the differential lines, counteraction against common mode noise is required, and a common mode choke coil is frequently used for removing the common mode noise.

As a publicly-known example of this technique, Japanese Patent Laid Open Publication No. 2004-266634 (Patent document 1) discloses a structure in which a lower limit of a frequency band of a normal mode signal is set to 2 MHz, and also Japanese Patent Laid Open Publication No. 2000-58343 (Patent document 2) discloses a structure where a common mode choke coil for differential signal line is wound around a toroidal core.

Incidentally, as shown in an equivalent circuit of FIG. 11, an ideal common mode choke coil has a structure as follows: a transmission line is formed by a pair of coils with a coupling coefficient close to "1", the coils being wound around a magnetic core, and there is an inter-coil capacitance between the input/output sides, with an inter-wire capacitance suppressed to be low. Thus, characteristic impedance is managed.

In the common mode choke coil with this structure, an equivalent inductance inserted to the differential lines for the common mode noise is increased to be a larger value, thus preventing the pass of the common mode noise based on the transmission characteristic shown by designation mark Scc21 of FIG. 12.

Meanwhile, in the common mode choke coil, the inductance for the differential signal (normal mode signal) is closer to zero, and a low-loss transmission line is formed in combination with the inter-wire capacitance. Therefore, as is shown in the transmission characteristic shown by the designation mark Sdd21 of FIG. 12, the differential signal is allowed to be transmitted, with a low loss.

Such an ideal common mode choke coil has not been presently commercialized. FIG. 12 shows a structure designed for 15 GHz Bandwidth, in comparison with an effect of the present invention.

PRIOR ART DOCUMENT

Patent Document

Patent Document 1:
Japanese Patent Laid Open Publication No. 2004-266634
Patent Document 2:
Japanese Patent Laid Open Publication No. 2000-58343

SUMMARY OF THE INVENTION

Problem to be Solved by the Invention

However, the aforementioned common mode choke coil has a larger inductance, namely higher series impedance for the common mode noise, to thereby cut off the common mode noise. Therefore, when an input terminal is viewed from the common mode noise, an inside of the input terminal is close to a terminal open state, and the common mode noise applied to the input terminal shows a similar response at the input terminal portion as the response of a terminal end open line.

Therefore, in the input terminal portion, the applied common mode noise is superimposed on a reflected common mode noise which is generated by reflection of the applied common mode noise, thus easily raising a peak voltage of the common mode noise at the input terminal portion.

In order to facilitate a connection, the input terminal portion is mounted on electronic equipment in an exposed state, thus making it difficult to carry out shielding, allowing easy electromagnetic radiation from here, and causing electromagnetic interference to occur. Such a rise of a peak voltage of the common mode noise at the input terminal portion is not preferable.

Inventors of the present invention have already proposed a common mode filter that can distribute a reflected common mode noise in a time domain (see patent application No. 2009-220549(Japanese Patent Laid Open Publication No. 2011-71710)). According to this common mode filter, the peak voltage of the reflected common mode noise can be suppressed to be low, and further it is found by the inventors of the present invention, that power of the reflected common mode noise can be extinguished. Thus, the present invention is completed.

In order to solve the above-described problem, the present invention is provided, and an object of the present invention is to provide a common mode filter capable of securing a transmission of a high-speed differential signal in a high-speed differential line, capable of extinguishing a power of a reflected common mode noise, and hardly causing electromagnetic interference to occur.

Means for Solving the Problem

In order to solve the above-described problem, an aspect of the present invention provides a common mode filter, comprising:
a lumped-constant differential delay line formed by arranging inductors, being passive series elements, and capacitors, being passive parallel elements, in a ladder-shaped differential four terminal network composed of the passive series elements arranged in series in each differential line and the passive parallel elements arranged in parallel between the differential lines, wherein the capacitors, being passive parallel elements are formed by two capacitors which are equivalent to each other, having same values, and are connected to each other in series; and a noise attenuating passive two terminal network connected between a connection point of the capacitors connected in series and a ground potential, including resistors for attenuating the common mode noise, a series circuit of the inductors and the resistors, or a parallel circuit of the inductors and the resistors.

Another aspect of the present invention provides the common mode filter, wherein the lumped-constant differential delay line is formed into a constant K-type structure.

Another aspect of the present invention provides the common mode filter, wherein the lumped-constant differential delay line is formed into a derived m-type structure.

Another aspect of the present invention provides the common mode filter, wherein the lumped-constant differential delay line is formed into an all pass type structure.

Another aspect of the present invention provides the common mode filter, wherein the lumped-constant differential delay line and the noise attenuating passive two terminal network are formed as differential delay elements of one section, and a plurality of differential delay elements are arranged in the differential line in series in a ladder shape, thus forming a plurality of sections.

Another aspect of the present invention provides the common mode filter, wherein lumped-constant differential delay lines are arranged in series in a ladder shape between the differential delay elements.

Another aspect of the present invention provides the common mode filter, wherein resistors are connected between connection points of the capacitors in the lumped-constant differential delay line composed of the plurality of sections.

Another aspect of the present invention provides the common mode filter, wherein only common mode attenuating inductors are connected between the connection point of the capacitors in a part of the lumped-constant differential delay lines, and the ground potential.

Another aspect of the present invention provides the common mode filter, wherein the lumped-constant differential delay line is a composite line comprising two or three differential elements out of constant K-type, derived_m-type, and all pass type differential delay elements.

Another aspect of the present invention provides the common mode filter, wherein a constant of the noise attenuating passive two terminal network in the differential delay elements is set to be different in each section.

Advantage of the Invention

In the common mode filter according to an aspect of the present invention, the lumped-constant differential delay line is used, which is formed by arranging inductors, being passive series elements, and capacitors, being passive parallel elements, wherein the capacitors, being the parallel elements, are formed by two capacitors equivalent to each other, having equal values, and connected in series, and the noise attenuating passive two terminal network is connected between the connection point of the capacitors connected in series and the ground potential, including resistors for attenuating the common mode noise, the series circuit of the inductors and the resistors, or the parallel circuit of the inductors and the resistors. Therefore, a high-speed differential signal can be transmitted, and meanwhile an undesirable common mode noise can be cut off and can be absorbed by resistors, thus reducing the peak voltage of the common mode noise at the input terminal portion and hardly causing the electromagnetic interference to occur.

In the common mode filter according to an aspect of the present invention, the lumped-constant differential delay line is formed into the constant K-type structure, and therefore the aforementioned effect can be obtained in this constant K-type structure.

In the common mode filter according to an aspect of the present invention, the lumped-constant differential delay line is formed into the derived m-type structure, and therefore the aforementioned effect can be obtained in this derived m-type structure.

In the common mode filter according to an aspect of the present invention, the lumped-constant differential delay line is formed into the all pass type structure, and therefore the aforementioned effect can be obtained in this all pass type structure.

In the common mode filter according to an aspect of the present invention, the lumped-constant differential delay line and the noise attenuating inductors are formed as differential delay elements of one section, and a plurality of differential delay elements are arranged in the differential line in series in a ladder shape, thus forming a plurality of sections, and therefore various filter characteristics can be obtained in addition to the aforementioned effect.

In the common mode filter according to an aspect of the present invention, the lumped-constant differential delay lines are arranged in series in a ladder shape between the differential delay elements, and therefore various filter characteristics can be obtained in addition to the aforementioned effect.

In the common mode filter according to an aspect of the present invention, the resistors are connected between connection points of the capacitors in the differential delay lines composed of the plurality of sections, and therefore various filter characteristics can be obtained in addition to the aforementioned effect.

In the common mode filter according to an aspect of the present invention, only the common mode attenuating inductors are connected between the connection point of the capacitors in a part of the lumped-constant differential delay lines and the ground potential, and therefore further various filter characteristics can be obtained.

In the common mode filter according to an aspect of the present invention, the lumped-constant differential delay line is formed as a composite line comprising two or three differential elements out of constant K-type, derived m-type, and all pass type differential delay elements, and therefore the aforementioned effect can be obtained in various pass type structures.

In the common mode filter according to an aspect of the present invention, the constant of the noise attenuating passive two terminal network in the differential delay elements is set to be different in each section, and therefore various filter characteristics can be obtained, such that the transmission characteristic of the common mode noise can be easily formed in a desired characteristic, and an absorption characteristic of the common mode noise can also be formed in a desired characteristic, and the electromagnetic interference can be surely prevented.

DETAILED DESCRIPTION OF THE INVENTION

Embodiments of a common mode filter according to the present invention will be described hereafter, with reference to the drawings.

First, a lumped-constant differential delay line, being a base of a common mode filter of the present invention, will be described.

Figure 1:
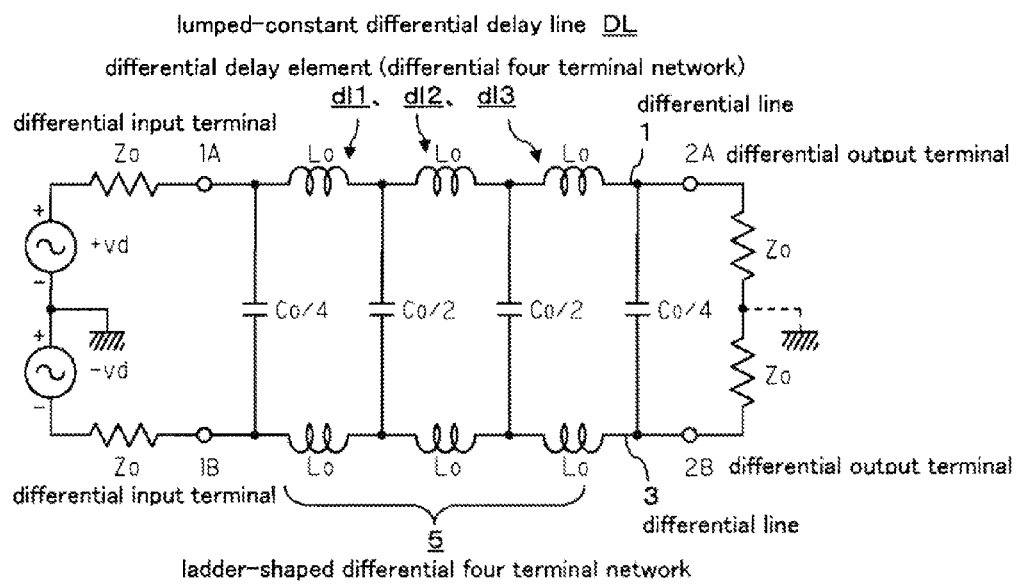
FIG. 1 is a circuit view showing an example of a lumped-constant differential delay line, being a base of a common mode filter of the present invention.

FIG. 1 is a circuit view showing an example of the lumped-constant differential delay line applied to the common mode filter of the present invention.

In FIG. 1, a ladder-shaped differential four terminal network 5 is formed in a pair of differential lines 1 and 3 between differential input terminals 1A, 1B, and differential output terminals 2A, 2B.

The ladder-shaped differential four terminal network 5 is formed into a ladder shape by combining and connecting passive series elements arranged in series in the differential lines 1 and 3, and passive parallel elements arranged in parallel between these differential lines 1 and 3.

Namely, a plurality of inductors Lo, being the passive series elements, for example, three inductors Lo are connected in series, in the differential line 1 between differential input/output terminals 1A and 2A, and the differential line 3 between differential input/output terminals 1B and 2B, and capacitors Co/4 and Co/2, being the passive parallel elements, are connected to both ends of the individual inductor Lo.

The capacitors Co/4 and Co/2 are connected between both ends of each inductor to at the same position in the differential lines 1, 3, thus forming a constant Kπ-type lumped-constant differential delay line DL composed of three sections.

Differential delay elements dl1, dl2, and dl3 of one section in the lumped-constant differential delay line DL constitute a ladder-shaped differential four terminal network which is formed by a pair of inductors Lo in the differential lines 1 and 3, and two capacitors Co/4 and Co/2 on both ends thereof. Capacitor Co/2 is shared by the adjacent differential delay elements dl1, dl2, and dl2, dl3.

In addition, a capacitance value of the capacitor Co/4 in the differential delay elements dl1, dl3 at the side of the differential input/output terminals 1A, 1B, 2A, 2B, is not shared with intermediate differential delay element dl2, and therefore the capacitance value is half of the capacitor Co/2 of the intermediate differential delay element dl2.

Delay time td of each differential delay element dl1 to dl3 is expressed as shown in "Formula 1".

$$td = \sqrt{LoCo} \quad \text{[Formula 1]}$$

Characteristic impedance Zd of each differential delay element dl1 to dl3 is expressed as shown in "Formula 2".

$$Zd = 2\sqrt{Lo/Co} \quad \text{[Formula 2]}$$

In FIG. 1, the capacitance of the capacitor of one section of differential delay elements dl1 to dl3 is expressed by Co/4 and Co/2, thereby making the notation of the delay time td coincide with the formula in generally known single-ended delay lines.

Note that in FIG. 1, +vd and −vd at the side of the differential input terminals 1A and 1B show differential power sources of impedance Zo, and Zo at the side of the differential output terminals 2A and 2B shows termination impedance.

Next, the common mode filter according to the present invention will be described in detail.

Figure 2:
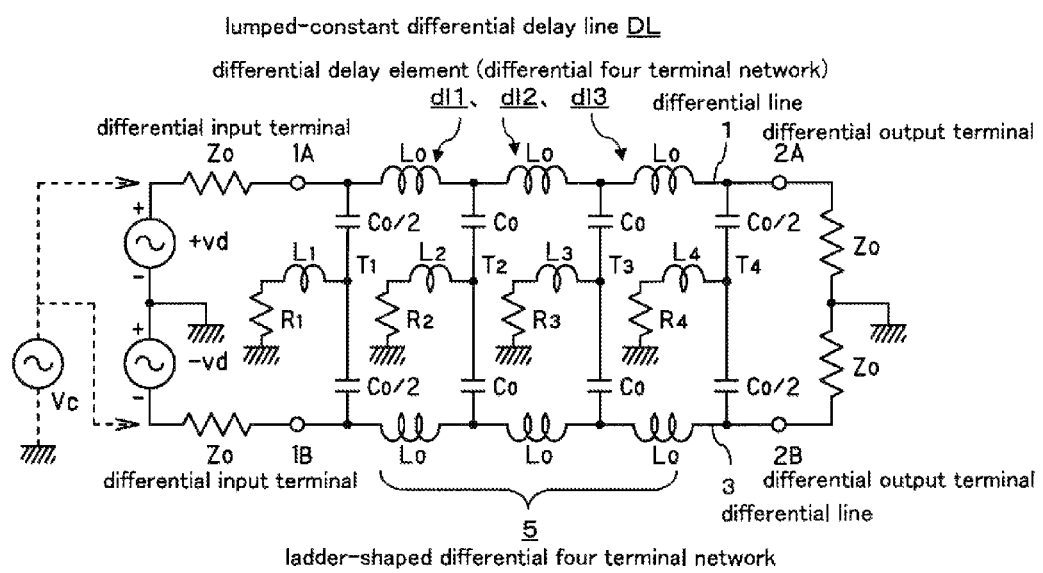
FIG. 2 is a circuit view showing the common mode filter according to a first embodiment of the present invention.

FIG. 2 is a circuit view explaining a first structure of the common mode filter of the present invention, and shows an improved lumped-constant differential delay line of FIG. 1. Vc in FIG. 2 shows a source of the common mode noise.

As shown in FIG. 2, two capacitors Co/4 and Co/2 connecting both ends of the pair of inductors Lo on the differential lines 1 and 3 in each differential delay elements dl1 to dl3 of FIG. 1, are divided into two capacitors Co/2 and Co/2 or Co and Co connected in series. In addition, series composition capacitance of the capacitors Co/2 and Co/2 are equivalent to the capacitor Co/4, and similarly the series composition capacitance of the capacitors Co and Co is equivalent to the capacitor Co/2.

Namely, the capacitance of the two divided capacitors Co/2, Co has a capacitance value of twice of one capacitor Co/4, Co/2 before being divided.

In each of the differential delay elements dl1 to dl3, a series circuit of inductors and resistors for attenuating the common mode noise, namely a passive two terminal network connecting L1 and R1, L2 and R2, L3 and R3, L4 and R4 in series, is connected between each connection points T1, T2, T3, T4 of the capacitors Co/2 and Co/2 or Co and Co, and the ground potential.

A series resonance circuit is formed by combining the inductors L1 to L4 for attenuating the common mode noise, with capacitors Co/2, Co connected to each inductor, and this resonance frequency is set to be a frequency of a pole for attenuating the common mode noise. Wherein "Q" of the series resonance circuit is decreased by resistors R1 to R4, and therefore an attenuation pole is formed into a shallow broad form or does not appear clearly. The other structure is the same as the structure of FIG. 1.

In such a common mode filter, by using the lumped-constant differential delay elements dl1 to dl3, being the aforementioned ladder-shaped four terminal network, as a ladder-shaped differential four terminal network 5 formed in the differential lines 1 and 3, the differential signal that propagates through the differential lines 1 and 3, can be transmitted there through with amplitude characteristics and group delay characteristics as aimed.

Namely, in the first structure, differential signals that transmit through the differential lines 1 and 3 are mutually antiphase signals, and therefore even if these signals reach each connection point T1 to T4 of capacitors Co/2 and capacitors Co, the signals are mutually cancelled out and disappear.

Therefore, the series resonance circuit does not contribute to the differential signal, and the differential signal is transmitted without deterioration, as designed by the differential delay elements dl1 to dl3.

Meanwhile, in the first structure, the series resonance circuit responding to the common mode noise is formed, by two capacitors Co/2 and Co, being parallel elements that form the differential delay elements dl1 to dl3, and inductors L1 to L4 for attenuating the common mode noise connected to these connection points T1 to T4. Therefore, the common mode noise is attenuated and cut-off, thus making it possible to facilitate the attenuation of the common mode noise as designed. In addition, "Q" shown by the series resonance circuit is decreased by the resistors R1 to R4, and the common mode noise is consumed and absorbed.

In this case, an absorption amount of the common mode noise is largest in the vicinity of the frequency of the common mode noise attenuation pole, and the absorption amount is reduced in other frequencies. Therefore, an unabsorbed common mode noise is attenuated and cut off, to become a reflected common mode noise, and is returned to the differential input terminals 1A, 1B.

Further, the reflected common mode noise is propagated through the differential delay elements dl1 to dl3, and returns to the differential input terminals 1A and 1B, requiring two-fold propagation delay time by round trip. Therefore, the common mode noise that is applied, and the common mode noise that reflects and returns, are superimposed on each other, with phases deviated from each other at the differential input terminals 1A and 1B.

In addition, rise of the peak voltage of the common mode noise at the differential input terminals 1A and 1B is small because the reflected common mode noise is only a remained component that is not completely absorbed by the resistors R1 to R4, and the electromagnetic radiation of the noise is hardly generated at the differential input terminals 1A and 1B.

Figure 3:
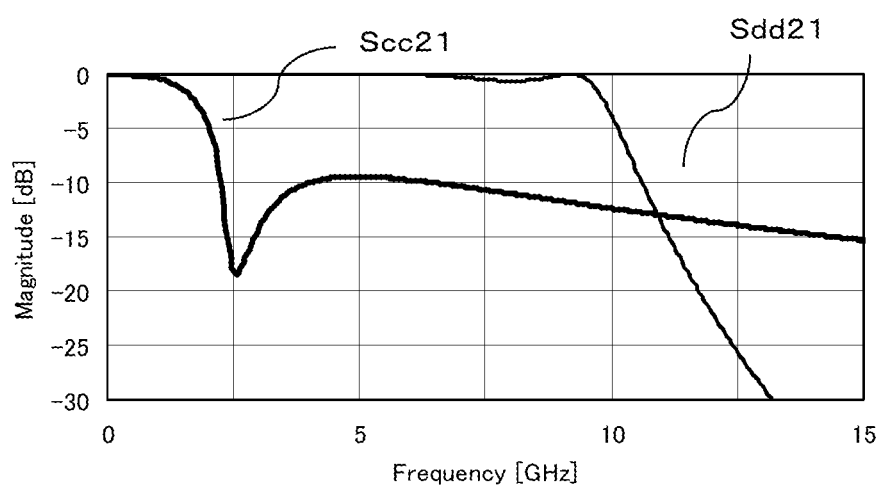
FIG. 3 is a transmission characteristic view of the common mode filter of the present invention shown in FIG. 2.

FIG. 3 is a characteristic view of the common mode filter of the present invention shown in FIG. 2, wherein Sdd21 shows differential signal transmission characteristic, and Scc 21 shows common mode noise transmission characteristic in the figure. FIG. 3 is characterized in that delay time of one section is set to 30 ps, and differential impedance is set to 100 ohms, and the frequency bandwidth of the differential signal is set to about 10 GHz so that a frequency component of 7.5 GHz can sufficiently pass, which is a third order harmonic frequency component of a differential clock of 2.5 GHz, on the assumption that the common mode noise of the differential clock of 2.5 GHz is removed, and further the constant of each element is set so that an attenuation of the common mode noise of the differential clock of 2.5 GHz is about 18 dB.

Here, in order to examine how much the common mode noise is absorbed and attenuated, a transmitted power ratio, a reflected power ratio, and an absorbed power ratio are obtained for every frequency, with input power of the common mode noise in the ladder-shaped differential four terminal circuit network 5 set as 100%.

Figure 4:
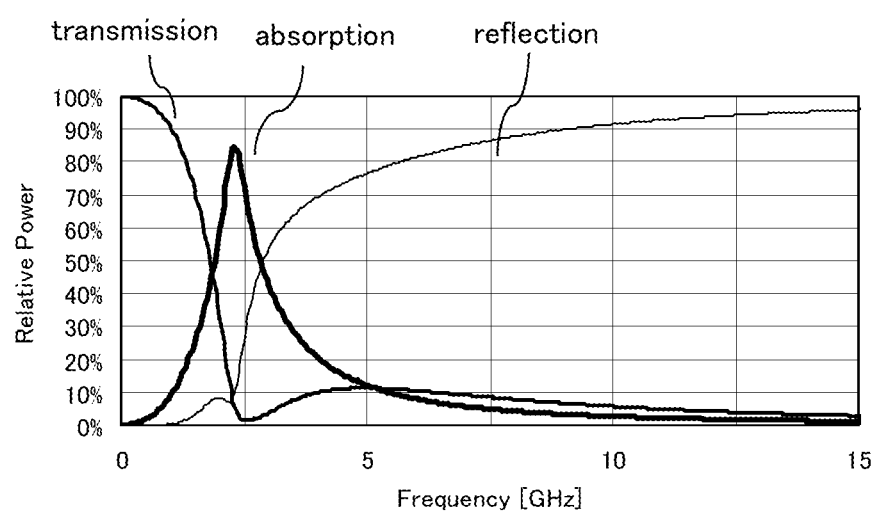
FIG. 4 is a power distribution characteristic view of the common mode filter of the present invention shown in FIG. 2.

FIG. 4 shows the transmitted power ratio, the reflected power ratio, and the absorbed power ratio of the common mode noise inputted into the common mode filter of the present invention shown in FIG. 2. The peak of the power absorption is set in the vicinity of 2.5 GHz, which is found to be suitable for removing the common mode noise of the differential clock of 2.5 GHz.

Such a structure is effective for removing the common mode noise of a specific frequency, and in order to set the peak of the power absorption to a desired frequency, constants of the inductors L1 to L4 and the resistors R1 to R4 may be set and adjusted for every section.

Figure 11:
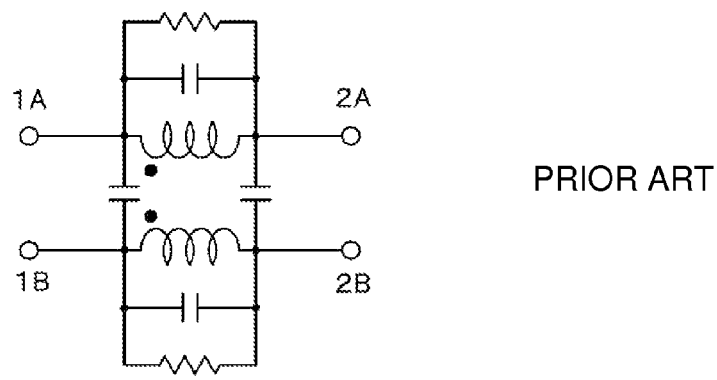
FIG. 11 is an equivalent circuit view of a conventional common mode choke coil.
Figure 12:
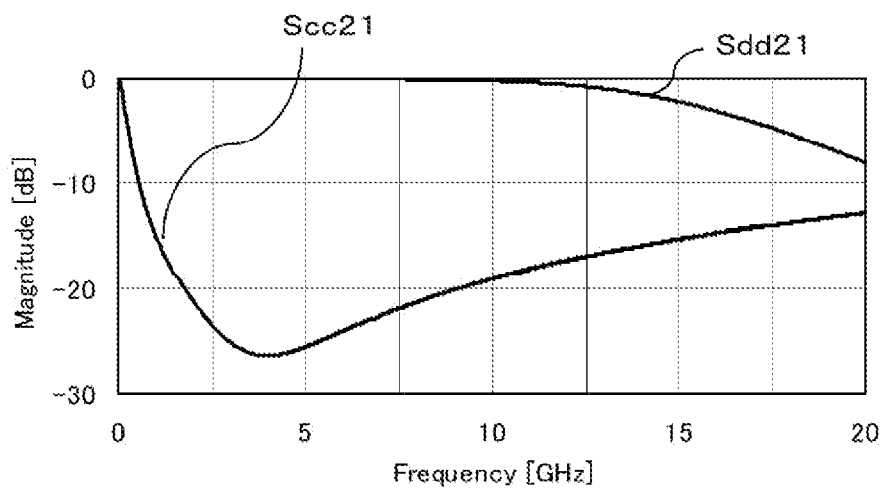
FIG. 12 is a transmission characteristic view of the conventional common mode choke coil shown in FIG. 11.
Figure 13:
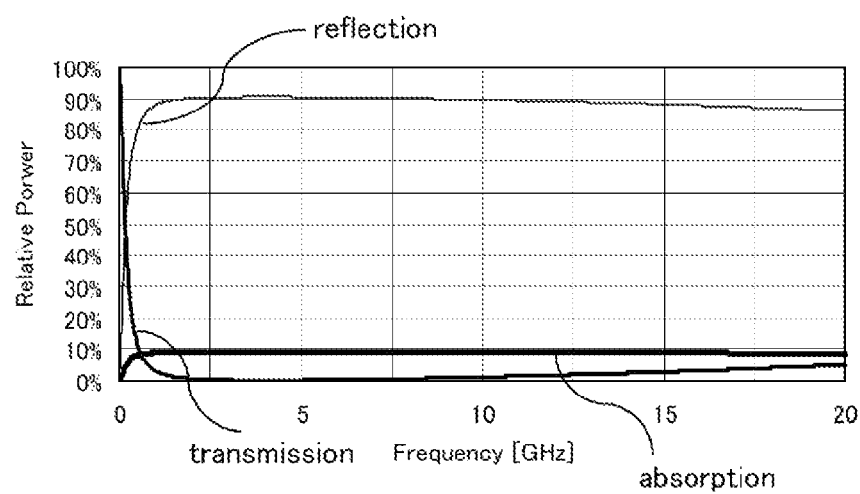
FIG. 13 is a power distribution characteristic view of the conventional common mode choke coil shown in FIG. 11.

Further, FIG. 13 shows the transmitted power ratio, the reflected power ratio, and the absorbed power ratio of the common mode noise inputted into an ideal common mode choke coil shown in FIG. 11, for comparison. In a conventional common mode choke coil, it is found that most of the input power of the common mode noise is cut off and reflected, and about 90% of the input power is reflected.

Note that if the inductors L1 to L4 are formed by a metal conductor such as nichrome, etc., having high resistivity, a series resistance component is generated in the inductors L1 to L4 themselves, even if not connecting the resistors R1 to R4, and therefore the same effect can be obtained as the effect obtained by equivalently connecting the resistors R1 to R4.

Figure 5:
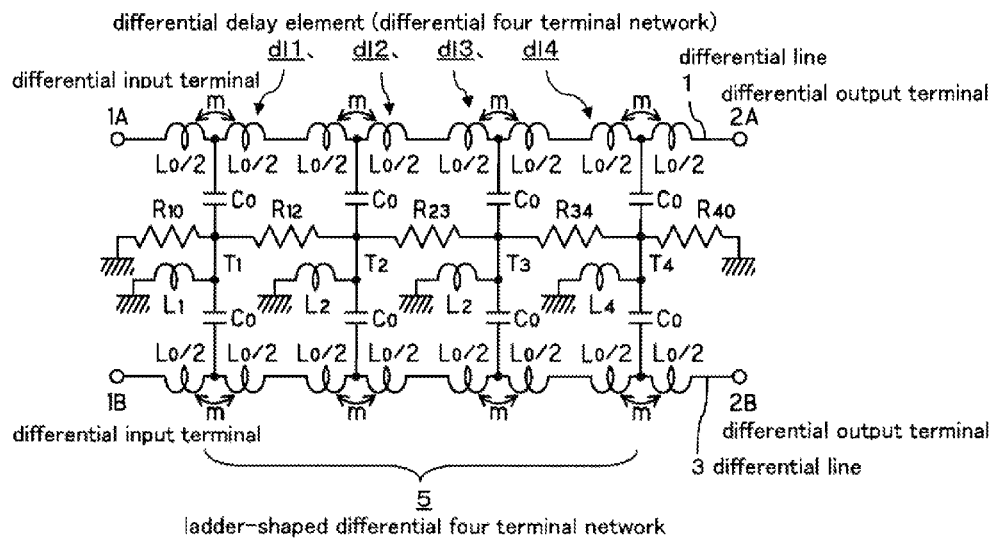
FIG. 5 is a circuit view showing a common mode filter according to a second embodiment of the present invention.

FIG. 5 shows a second embodiment of the common mode filter of the present invention, with a derived mT-type lumped-constant differential delay line composed of four sections as a base.

Specifically, in each of the four differential delay elements dl1 to dl4, inductors Lo that form the passive series elements are equally divided into two, then the equally divided inductors Lo/2 are connected in series, and mutual inductive m-coupling is made between them, and connection points of the two equally divided inductors Lo/2 are connected by a series circuit of the capacitors. The other structure is the same as the structure of FIG. 1.

In the structure of FIG. 5 as well, the parallel elements of each differential four terminal network are converted to the series circuit of two capacitors Co and Co having two-fold capacitance values, and the aforementioned inductors L1 to L4 for attenuating the common mode noise are connected between the connection points T1, T2, T3, T4 of capacitors Co connected in series, and the ground potential. This structure is equivalent to the structure of FIG. 2 in which the resistors R1 to R4 for attenuating the common mode noise are set to on.

Further, resistors R12, R23, and R34 are connected between connection points T1 and T2, between T2 and T3, and between T3 and T4, and resistors R10 and R40 are connected between the connection points T1 and the ground, and between the connection point T4 and the ground.

Note that in the figure thereafter, only a part between the differential input terminals 1A, 1B, and the differential output terminals 2A, 2B is shown.

With this structure, the noise attenuating passive two terminal network with a complicated route is formed. For example, the passive two terminal network connected to the connection point T1 is not only formed as the parallel circuit of the inductor L1 and the resistor R10, but also as a circuit in which various routes connected to the ground via the resistor R12 are additionally connected to the parallel circuit.

With this structure, the inductors that constitute the passive series elements of the ladder-shaped differential four terminal network 5 are expressed by (Lo+2m) equivalently, and the passive parallel elements are equivalently converted to a circuit in which the capacitors Co and a negative inductor component −m are connected in series.

Delay time td of one section of each differential delay element dl1 to dl4 is shown by "Formula 3".

$$td = \sqrt{(Lo+2m)Co} \quad \text{[Formula 3]}$$

Characteristic impedance Zd of each differential delay element dl1 to dl4 is shown by "Formula 4".

$$Zd = 2\sqrt{(Lo+2m)/Co} \quad \text{[Formula 4]}$$

Figure 6:
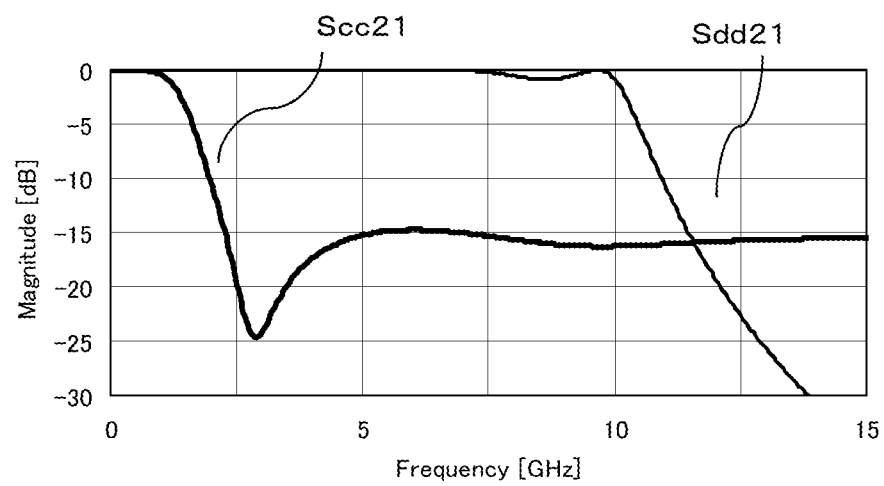
FIG. 6 is a transmission characteristic view of the common mode filter of the present invention shown in FIG. 5.

FIG. 6 is a characteristic view of the common mode filter shown in FIG. 5, and in the figure, Sdd21 indicates the differential signal transmission characteristic, and Scc21 indicates the common mode noise transmission characteristic. This is an example that the constant of each element is defined so that the delay time of one section is set to 37.5 ps and the characteristic impedance is set to 100 ohms.

Note that in a circuit analysis, instead of the value of the mutual induction m, as shown in "Formula 5" as will be described later, the ratio of the mutual induction m with respect to the inductor Lo/2, namely coupling coefficient k is used generally, wherein k=0.24.

$$k=m/(Lo/2)$$ [Formula 5]

In this case as well, a series resonance frequency exists, which is determined in a combination of the common mode noise attenuating inductors L1 to L4, the mutual induction m, and Co. However, "Q" of the series resonance circuit is decreased by resistors R10 to R40, and therefore the attenuation pole is shown in a broad form.

Further, the differential signal transmission characteristic Sdd21 is similar to the characteristic of FIG. 3, and meanwhile the common mode noise transmission characteristic Scc21 shows the attenuation of about 15 dB at a frequency of 2.5 GHz or more, and it is found that a larger attenuation can be obtained in a larger frequency range than the frequency range of FIG. 3.

Figure 7:
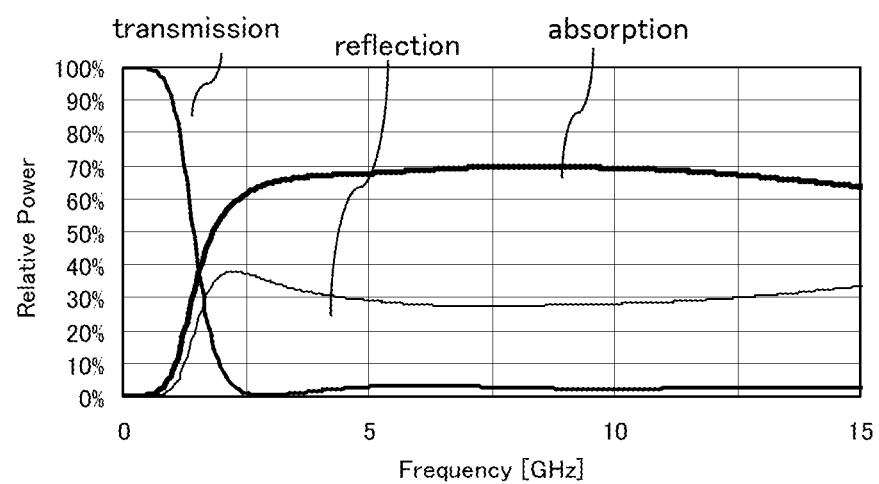
FIG. 7 is a power distribution characteristic view of the common mode filter of the present invention shown in FIG. 5.

FIG. 7 shows a power distribution ratio of the transmitted power ratio, the reflected power ratio and the absorbed power ratio of the input power of the common mode noise. As is clarified from FIG. 7, the structure shown in FIG. 5 indicates an absorption of 60% to 70% at the frequency of 2.5 GHz or more, and it is found that there is no absorption peak in a specific frequency as shown in FIG. 4.

Accordingly, this structure is effective when the common mode noise exists in a broad frequency range.

Figure 8:
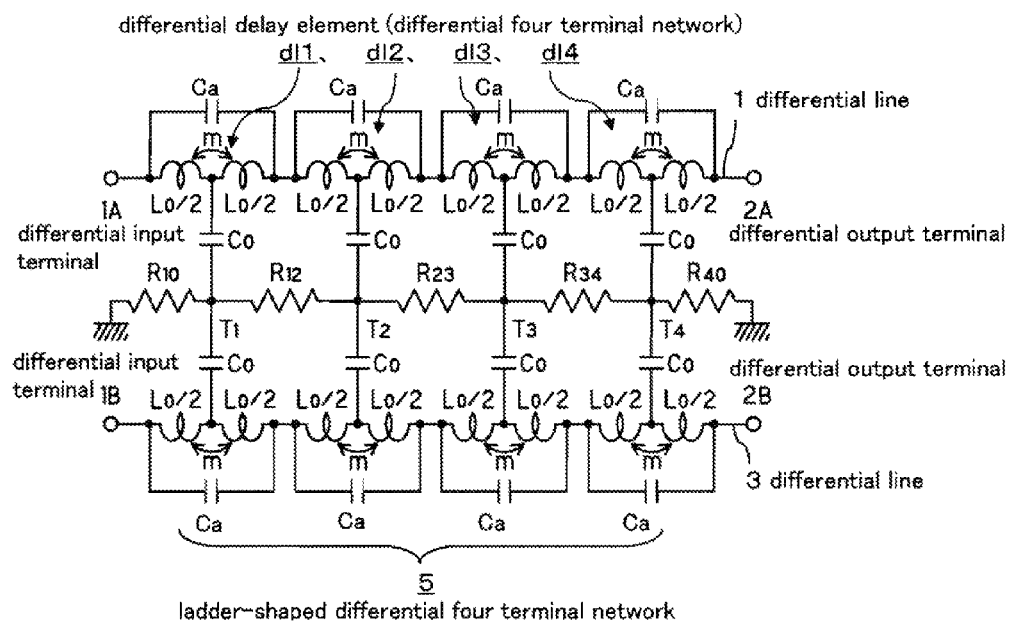
FIG. 8 is a circuit view of a common mode filter according to a third embodiment of the present invention.

FIG. 8 shows a third embodiment of the common mode filter of the present invention.

Namely, the all pass lumped-constant differential delay line is composed of four differential delay elements dl1 to dl4, and in each differential delay element dl1 to dl4, inductors Lo that form the passive series elements are equally divided into two, then the equally divided inductors Lo/2 are connected in series, and mutual inductive m-coupling is made between them. Further, both ends of the inductors Lo/2 connected in series are bridged by capacitor Ca, and the connection points of both inductors Lo/2 between the differential lines 1 and 3 are connected by the series circuit of the capacitors Co. The other structure is the same as the structure of FIG. 5.

With this structure, regarding the inductors that constitute the passive series elements of the ladder-shaped differential four terminal network, the inductors for determining a delay time of one section are expressed by (Lo+2m) equivalently, and the parallel elements are equivalently converted to a circuit in which the capacitors Co and the negative inductor component −m are connected in series.

In this structure as well, the parallel elements are converted to two capacitors connected in series having two-fold capacitance values, and the connection points of the two capacitors Co connected in series are set as T1, T2, T3, T4 sequentially from the side of the differential input terminals 1A and 1B, and the resistors R12, R23, and R34 are connected between connection points T1 and T2, between T2 and T3, and between T3 and T4, and the resistors R10 and R40 are connected between the connection points T1 and the ground, and between the connection point T4 and the ground. This structure is equivalent to a structure that the number of the common mode noise attenuating inductors L1 to L4 is infinite. The other structure is the same as the structure of FIG. 5.

The delay time td of one section in each differential delay element dl1 to dl4 with this structure is shown by "Formula 6".

$$td=\sqrt{(Lo+2m)Co}$$ [Formula 6]

Differential impedance Zd in each differential delay element dl1 to dl4 is shown by "Formula 7".

$$Zd=2\sqrt{(Lo+2m)/Co}$$ [Formula 7]

Figure 9:
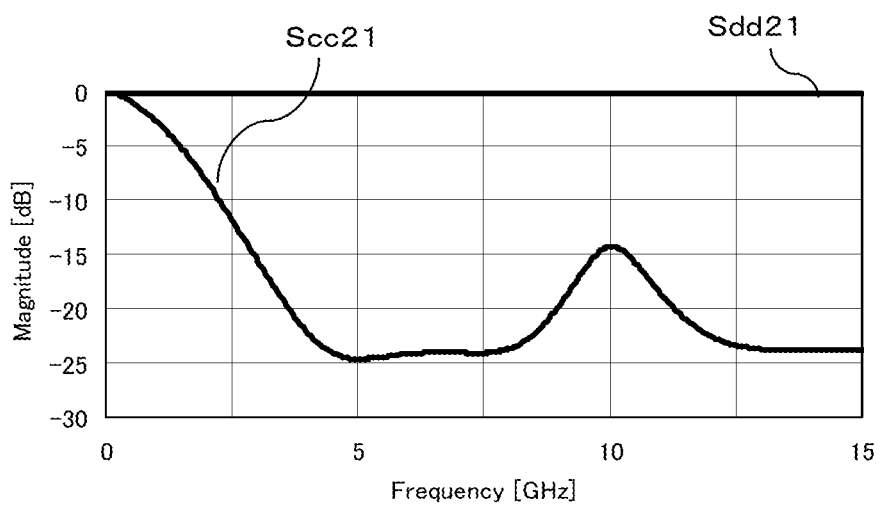
FIG. 9 is a transmission characteristic view of the common mode filter of the present invention shown in FIG. 8.

FIG. 9 is a characteristic view of the common mode filter shown in FIG. 8, and Sdd21 indicates the differential signal transmission characteristic, and Scc21 indicates the common mode noise transmission characteristic. As the characteristic of FIG. 9, an example is shown in which the constant of each element is defined so that the delay time of one section is 50 ps, and the characteristic impedance is 100 ohms.

In the structure of FIG. 8 as well, similarly to a case of FIG. 5, the coupling coefficient k is used instead of the mutual induction m, wherein k=0.4 here. In a case of all pass lumped-constant differential delay line of FIG. 8, the coupling coefficient is preferably set to be a larger value than a case of the derived m-type.

Further, bridge capacitor Ca is disposed, and when the coupling coefficient k is 0.4, a value of about ⅒ of the capacitors Co is used for the bridge capacitor Ca.

With this structure, the common mode noise that reaches each of the connection points T1 to T4, is returned to the ground via the resistors R10 to R40, and therefore the power absorption occurs by these resistors R10 to R40 at this time.

Further, although the transmission characteristic of the common mode noise is slightly changed by the values of the resistors R10 to R40, it is more largely influenced by the delay time of the differential delay elements dl1 to dl4, and as the delay time of the differential delay elements dl1 to dl4 becomes larger, transmission of the common mode noise from a lower frequency can be inhibited.

Figure 10:
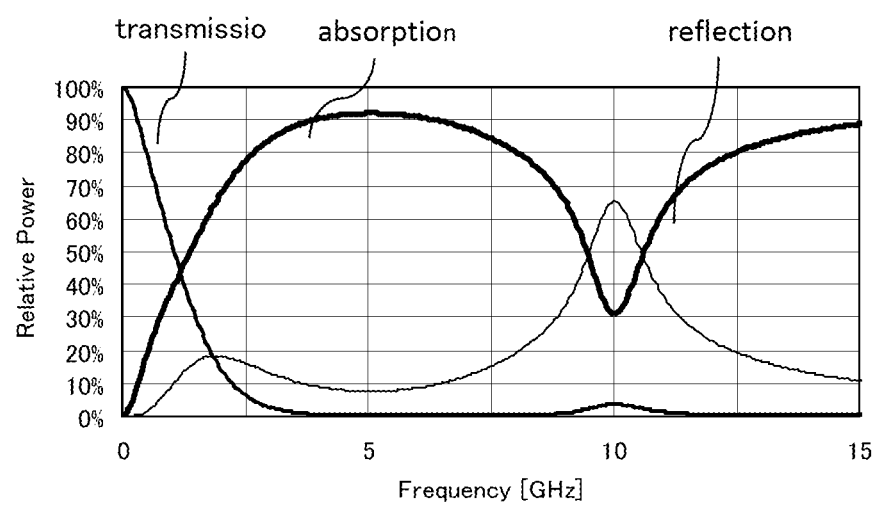
FIG. 10 is a power distribution characteristic view of the common mode filter of the present invention shown in FIG. 8.

FIG. 9 shows the differential transmission characteristic Sdd21 and the common mode noise transmission characteristic Scc21 in the common mode filter having the structure of FIG. 8 according to the present invention, and FIG. 10 shows the power distribution ratio of the transmitted power ratio, the reflected power ratio, and the absorbed power ratio of the common mode noise power inputted into the common mode filter having the structure of FIG. 8.

According to the common mode transmission characteristic Scc21 of FIG. 9, since the transmission characteristic can't be formed by the common mode noise attenuating inductors L1 to L4 compared with the structure of FIG. 2 and FIG. 5, the frequency at a start of attenuation is moved to the high frequency side, and only attenuation of about 12 dB can be obtained if compared at the frequency of 2.5 GHz. Meanwhile, as shown in FIG. 10, the absorption of the common mode noise power is 70% or more in a frequency range of 2.2 GHz to 8.7 GHz, and a wider absorption peak can be obtained than other structure.

Further, the loss of the differential signal transmission characteristic Sdd21 is approximately 0 dB in FIG. 9. Therefore, the all pass lumped-constant differential delay line is optimal for the purpose of transmitting an ultrahigh speed signal of the GHz bandwidth.

Note that in the structure of FIG. 5 and FIG. 8, the resistors connected between the connection points of T1 to T4 are not necessarily connected between the connection points of the adjacent sections, and may be connected between the connection points away from each other by two sections or more.

As described above, the constant K-type, derived -m type, and all pass type three kinds of lumped constant differential delay lines are used to exemplify the common mode filter having a different structure in each type. However, according to the present invention, all lumped-constant differential delay lines can be applied to the common mode filter having all of the aforementioned structures.

Further, in the common mode filter of the present invention, explanation is given for the lumped-constant differential delay line using three types such as constant K-type, derived m-type, or all pass type. However, the other structure is also acceptable.

For example, in the derived m-type structure, mutual induction is made between the adjacent inductors, being the series elements of the ladder-shaped differential delay line. Meanwhile, although not shown, it is also known that the mutual induction is made between the inductors of the sections away from each other by two sections or more. With this structure as well, the structure of the present invention can be applied, and the same effect can be obtained.

Namely, the object of the present invention is achieved when the lumped-constant differential delay line has a composite structure of two or more differential delay elements, wherein for example two constant K-type differential delay elements and three derived m-type differential delay elements are connected in a ladder shape, out of the constant K-type, derived m-type, and all pass type differential delay elements.

Further, although not shown, a flat group delay low pass filter can also be used as other differential delay line.

Although the structure of the flat group delay low pass filter is similar to the constant K-type structure at a first glance, commercialization thereof is difficult because values of the inductors, being the passive series elements, and the capacitors, being the passive parallel elements, are all different in a case of a single end structure composed of a plurality of sections.

As described above, the common mode filter of the present invention having differential delay lines including inductors, being passive series elements, and capacitors, being passive parallel elements, in a ladder-shaped differential four terminal network, allows a desired ultrahigh speed differential signal to transmit and propagate through the ultrahigh speed differential transmission line, and hardly allows an undesirable common mode noise to transmit by attenuating such a common mode noise. In addition, electromagnetic radiation intensity of the cut-off and reflected common mode noise can be suppressed to be low by absorbing the reflected common mode noise and suppressing the peak value thereof to be low.

Further, the aforementioned examples of the present invention are explained in a case that all differential delay lines are composed of a plurality of sections. However, there is also a case that the common mode noise exists only in a specific frequency. In this case, for example, the lumped-constant differential delay line of FIG. 5 may be composed of only one section as the derived mT-type, and the frequency of one existing attenuation pole may be set to be coincident with the frequency of the common mode noise.

Further, in the common mode filter of the present invention, it is also acceptable that the lumped-constant differential delay lines DL are arranged in series in a ladder shape between differential delay elements dl1 to dl4, namely, the lumped-constant differential delay lines DL are arranged between the differential delay elements dl1 to dl4 between the input/output sides, or it is also acceptable that the noise attenuating passive two terminal network is not connected in a part or all of the differential delay elements dl2 to dl3 in the middle of the differential delay elements dl1 and dl4 between the input/output sides.

Further, in the common mode filter of the present invention, when a plurality of sections are formed, it is also acceptable that a conventional differential delay line, for example, the common mode noise attenuating inductors L1 to L4 and the resistors R1 to R40 are omitted in a part of the plurality of sections.

Further, it is also acceptable that only the common mode attenuating inductors are connected between the connection points of the capacitors in a part of the lumped-constant differential delay lines DL, and the ground potential.

Namely, transmission of the common mode noise is suppressed by connecting only inductors between the connection points of the capacitors in a part of the lumped-constant differential delay lines DL, and the ground potential, and forming the resonance circuit by the capacitors and the inductors, and obtaining the common mode noise attenuation pole.

Specifically, in the aforementioned structure of FIG. 2, the lumped-constant differential delay line composed of one section has a structure that inductor L2 or L3 is directly connected to the ground potential excluding resistor R2 or R3, or in the structure of FIG. 5, resistors R12 and R23 are excluded.

Description of Sings and Numerals
1, 3 Differential line
1A, 1B Differential input terminal (input side)
2A, 2B Differential output terminal (output side)
5 Ladder-shaped differential four terminal network
Co, Co/2, Co/4, Ca Capacitor
DL Lumped-constant differential delay line
D11, dl2, dl3, dl4 Differential delay element (differential four terminal network)
Lo, Lo/2 Inductor
L1, L2, L3, L4 Common mode noise attenuating inductor (noise attenuating passive two terminal network)
R1, R2, R3, R4, R10, R12, R23, R34, R40 Common mode noise attenuating resistor (noise attenuating passive two terminal network)
T1, T2, T3, T4 Connection point
+vd, −vd Differential power source
Vc Common mode noise source

The invention claimed is:

1. A common mode filter, comprising:
a lumped-constant differential delay line formed by arranging inductors, being passive series elements, and capacitors, being passive parallel elements, in a ladder-shaped differential four terminal network composed of the passive series elements arranged in series in each differential line and the passive parallel elements arranged in parallel between the differential lines,
wherein two of the capacitors having same values as each other and forming an equivalent capacitance for the passive parallel elements are connected in series; and a passive two terminal network including only resistors, or a parallel circuit of additional inductors and the resistors, said resistors connected between a connection point of the two capacitors connected in series and a ground potential to constitute a returning path of common mode current to the ground potential to generate an attenuation of the common mode noise by the absorption at said resistors in the passive two terminal network, and wherein the lumped-constant differential delay line and the passive two terminal network are formed as differential delay elements of one section, the differential delay elements are arranged in plural in series in a ladder shape, thus forming a plurality of sections.

2. The common mode filter according to claim 1, wherein the lumped-constant differential delay line is formed into a constant K-type structure.

3. The common mode filter according to claim 1, wherein the lumped-constant differential delay line is formed into a derived m-type structure.

4. The common mode filter according to claim 1, wherein the lumped-constant differential delay line is formed into an all pass type structure.

5. The common mode filter according to claim 1, wherein the lumped-constant differential delay line is any one or a composite of constant K-type, derived m-type, and all pass type differential delay elements.

6. The common mode filter according to claim 5, wherein additional lumped-constant differential delay lines, which are separate lines from the respective line that connects each of the passive two terminal networks between a connection point of the corresponding two capacitors connected in series and the ground potential, are arranged in series in a ladder shape between the differential delay elements.

7. The common mode filter according to claim 6, wherein a constant of the passive two terminal network in the differential delay elements is set to be different in each of section.

8. The common mode filter according to claim 5 or 6, wherein second resistors are connected between the respective connection points of each of the corresponding two capacitors in the lumped-constant differential delay line composed of the plurality of sections.

9. The common mode filter according to claim 8, wherein a constant of the passive two terminal network in the differential delay elements is set to be different in each section.

10. The common mode filter according to claim 5, wherein a constant of the passive two terminal network in the differential delay elements is set to be different in each section.

* * * * *